(12) United States Patent
Shimizu

(10) Patent No.: US 10,705,147 B2
(45) Date of Patent: Jul. 7, 2020

(54) REMAINING CAPACITY DETECTION CIRCUIT OF RECHARGEABLE BATTERY, ELECTRONIC APPARATUS USING THE SAME, AUTOMOBILE, AND DETECTING METHOD FOR STATE OF CHARGE

(71) Applicant: ROHM CO., LTD., Ukyo-Ku, Kyoto (JP)

(72) Inventor: Takahiro Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 690 days.

(21) Appl. No.: 15/378,612

(22) Filed: Dec. 14, 2016

(65) Prior Publication Data
US 2017/0176541 A1    Jun. 22, 2017

(30) Foreign Application Priority Data

Dec. 17, 2015  (JP) .................................. 2015-246612
May 12, 2016  (JP) .................................. 2016-096037

(51) Int. Cl.
*G01R 31/367*    (2019.01)
*G01R 31/3828*   (2019.01)
*B60L 58/12*     (2019.01)

(52) U.S. Cl.
CPC ............ *G01R 31/367* (2019.01); *B60L 58/12* (2019.02); *G01R 31/3828* (2019.01);
(Continued)

(58) Field of Classification Search
CPC .................................................. G01R 31/367
See application file for complete search history.

(56) References Cited

U.S. PATENT DOCUMENTS 9,035,616 B2    5/2015  Wortham
2010/0156356 A1*  6/2010  Asakura ............... H01M 10/44
                                                       320/148
(Continued)

FOREIGN PATENT DOCUMENTS

CN    102043132 A    5/2011
CN    102230953 B   10/2013
TW    201133985 A1   2/2011

OTHER PUBLICATIONS

TW Office Action corresponding to Application No. 10720255430; dated Mar. 23, 2018.

*Primary Examiner* — Raymond L Nimox
(74) *Attorney, Agent, or Firm* — Cantor Colburn LLP

(57) ABSTRACT

The present invention improves the detection accuracy of the state of charge of a battery. A coulomb count value CC is generated by integrating a charge/discharge current $I_{BAT}$ of a battery (S100). An SOC value SOC1 is calculated (S102). Based on an SOC-OCV characteristic predetermined for the battery, an OCV value OCV1 corresponding to the value SOC1 is generated (S112). A voltage $V_{BAT}$ of the battery is detected (S104). A voltage drop $V_{DROP1}$ between OCV1 and a detected value $V_{BAT1}$ of the voltage $V_{BAT}$ is generated (S114). A value OCV2 greater than the minimum operating voltage of the system by $\Delta V$, which corresponds to the voltage drop $V_{DROP1}$, is generated (S116). Based on the SOC-OCV characteristic, an SOC value SOC2 corresponding to OCV2 is generated (S118). Based on the value SOC2, at least one of the values SOC1, CC, $CC_{FULL}$, and SOC-OCV characteristics is corrected.

36 Claims, 15 Drawing Sheets

(52) U.S. Cl.
CPC ....... *B60Y 2200/91* (2013.01); *B60Y 2200/92* (2013.01); *B60Y 2400/112* (2013.01)

(56) References Cited

U.S. PATENT DOCUMENTS

| | | | | |
|---|---|---|---|---|
| 2011/0084702 A1* | 4/2011 | Mori | ................... | H01M 10/441 |
| | | | | 324/430 |
| 2011/0234167 A1* | 9/2011 | Kao | ................... | G01R 31/3828 |
| | | | | 320/132 |
| 2013/0275067 A1* | 10/2013 | Mikuteit | ................ | G06F 17/00 |
| | | | | 702/63 |
| 2015/0032394 A1* | 1/2015 | Kimura | .............. | G01R 31/3835 |
| | | | | 702/63 |
| 2015/0177331 A1* | 6/2015 | Nakayama | ............... | G06F 1/263 |
| | | | | 702/63 |
| 2015/0268309 A1* | 9/2015 | Kim | .................... | G01R 31/392 |
| | | | | 324/432 |
| 2015/0293183 A1* | 10/2015 | Tenmyo | ............... | H01M 10/48 |
| | | | | 324/429 |
| 2015/0357852 A1* | 12/2015 | Nakao | ................... | B60L 58/16 |
| | | | | 320/162 |

* cited by examiner

| SOC(%) | OCV(V) |
|---:|---:|
| 100 | 4.20 |
| 90 | 4.07 |
| 80 | 3.99 |
| 70 | 3.93 |
| 60 | 3.87 |
| 50 | 3.82 |
| 40 | 3.79 |
| 30 | 3.77 |
| 20 | 3.74 |
| 10 | 3.69 |
| 0 | 3.40 |

Figure 4

| SOC(%) | OCV(V) |
|---|---|
| 100 | 4.20 |
| 90 | 4.07 |
| 80 | 3.99 |
| 70 | 3.93 |
| 60 | 3.87 |
| 50 | 3.82 |
| 40 | 3.79 |
| 30 | 3.77 |
| 20 | 3.74 |
| 10 | 3.69 |
| 0 | 3.40 |

| SOC(%) | OCV(V) |
|---|---|
| 100 | 4.20 |
| 100−10×100/(100−SOC2) | 4.07 |
| 100−20×100/(100−SOC2) | 3.99 |
| 100−30×100/(100−SOC2) | 3.93 |
| 100−40×100/(100−SOC2) | 3.87 |
| 100−50×100/(100−SOC2) | 3.82 |
| 100−60×100/(100−SOC2) | 3.79 |
| 100−70×100/(100−SOC2) | 3.77 |
| 100−80×100/(100−SOC2) | 3.74 |
| 100−90×100/(100−SOC2) | 3.69 |
| 100−100×100/(100−SOC2) | 3.40 |

| SOC(%) | OCV(V) |
|---:|---:|
| 100 | 4.20 |
| 90 | 4.07 |
| 80 | 3.99 |
| 70 | 3.93 |
| 60 | 3.87 |
| 50 | 3.82 |
| 40 | 3.79 |
| 30 | 3.77 |
| 20 | 3.74 |
| 10 | 3.69 |
| 0 | 3.40 |
| −10 | 2.20 |

| SOC(%) | VDR |
|---:|---:|
| 100 | 1.00 |
| 90 | 1.02 |
| 80 | 1.05 |
| 70 | 1.07 |
| 60 | 1.10 |
| 50 | 1.12 |
| 40 | 1.14 |
| 30 | 1.17 |
| 20 | 1.20 |
| 10 | 1.30 |
| 0 | 1.76 |
| −10 | 2.96 |

Figure 12

5°C VDR-SOC Lookup table

| SOC (%) | VDR |
|---|---|
| 100 | 1.00 |
| 90 | 1.04 |
| 80 | 1.08 |
| 70 | 1.12 |
| 60 | 1.16 |
| 50 | 1.19 |
| 40 | 1.23 |
| 30 | 1.27 |
| 20 | 1.31 |
| 10 | 1.72 |
| 0 | 7.78 |
| -10 | 19.40 |

25°C VDR-SOC Lookup table

| SOC (%) | VDR |
|---|---|
| 100 | 1.00 |
| 90 | 1.01 |
| 80 | 1.03 |
| 70 | 1.04 |
| 60 | 1.06 |
| 50 | 1.07 |
| 40 | 1.09 |
| 30 | 1.10 |
| 20 | 1.12 |
| 10 | 1.19 |
| 0 | 1.51 |
| -10 | 10.49 |

45°C VDR-SOC Lookup table

| SOC (%) | VDR |
|---|---|
| 100 | 1.00 |
| 90 | 1.01 |
| 80 | 1.02 |
| 70 | 1.04 |
| 60 | 1.05 |
| 50 | 1.06 |
| 40 | 1.07 |
| 30 | 1.08 |
| 20 | 1.09 |
| 10 | 1.11 |
| 0 | 1.24 |
| -10 | 13.00 |

REMAINING CAPACITY DETECTION CIRCUIT OF RECHARGEABLE BATTERY, ELECTRONIC APPARATUS USING THE SAME, AUTOMOBILE, AND DETECTING METHOD FOR STATE OF CHARGE

CROSS REFERENCE TO RELATED APPLICATIONS

The present invention claims priority under 35 U.S.C. § 119 to Japanese Application No. 2015-246612, filed Dec. 17, 2015, and to Japanese Application No. 2016-096037, filed May 12, 2016, the entire contents of which are incorporated herein by reference.

BACKGROUND

This invention relates to a battery management system.

Battery-powered electronic devices, such as cellular phones, digital cameras, tablet terminals, portable music players, portable game apparatuses and notebook computers, all have built-in rechargeable batteries. Electronic circuits, such as CPUs (Central Processing Units) that control systems and process signals, liquid crystal panels, wireless communication modules and other analog or digital circuits, all receive their operating power from batteries.

FIG. 1 shows a block diagram of a battery-powered electronic device. An electronic device 500 comprises a battery 502 and a charging circuit 504 which charges the battery 502. The charging circuit 504 receives a source voltage VADP from an outer power adapter or a USB (Universal Serial Bus) and charges the battery 502.

A load 508 is connected to the battery 502. A battery current IBAT of the battery 502 is the difference between a charging current ICHG from the charging circuit 504 and a load current ILOAD of the load 508.

For battery-powered electronic devices, detection for remaining battery capacity (State Of Charge, SOC) is an essential function. In the electronic device 500, a remaining capacity detection circuit 506 is arranged. The remaining capacity detection circuit 506 is also called the fuel gauge IC (Integrated Circuit). There are two mainstream remaining battery capacity detecting methods using the remaining capacity detection circuit 506: (1) the voltage method, and (2) the coulomb count method (charge calculation method). The remaining capacity detection circuit 506 can also be built into the charging circuit 504.

The voltage method measures OCV (Open Circuit Voltage) of a battery in an open state (without any load), and estimates the remaining capacity according to the relation between OCV and SOC. OCV can only be measured when the battery is in an open state without any load. OCV cannot be correctly measured when the battery is under charging or discharging processes.

The coulomb count method measures the charging current flowing into a battery and the discharging current flowing out of the battery, and integrates the amount of charge being charged into and discharged from the battery, to estimate the remaining capacity. In contrast to the voltage method, the coulomb count method can estimate the remaining capacity while the battery is under operation, when the OCV cannot be measured.

The remaining capacity detection circuit 506 in FIG. 1 estimates the remaining capacity of the battery 502 using the coulomb count method. The remaining capacity detection circuit 506 includes a coulomb counter circuit 510 and an SOC calculator 512. The coulomb counter circuit 510 detects and integrates the battery current $I_{BAT}$ of the battery 502. A coulomb count value CC generated by the coulomb counter circuit 510 is expressed with the following equation:

$$CC = \int I_{BAT} dt$$

Strictly speaking, the battery current $I_{BAT}$ is sampled at discrete timings with a specified time period and is calculated by the following equation, where $\Delta t$ is the sampling period:

$$CC = \Sigma(\Delta t \times I_{BAT})$$

The integration can be performed on the assumption that a current $I_{BAT}$ flowing out of the battery 502 is a positive current and a current $I_{BAT}$ flowing into the battery 502 is a negative current.

The SOC calculator 512 uses the coulomb count value CC to calculate the SOC of the battery 502. The SOC is calculated using the following equation:

$$SOC[\%] = (CC_{FULL} \times CC)/CC_{FULL} \times 100$$

where $CC_{FULL}$ is the amount of charge (coulomb count value) stored in the battery 502 when the battery 502 is fully charged.

PRIOR TECHNICAL LITERATURE

[Patent Literature 1] U.S. Pat. No. 9,035,616B2.

BRIEF SUMMARY OF THE INVENTION

Problems to be Solved in the Present Invention

The inventor of the present invention studied the remaining capacity detection circuit 506 in FIG. 1 and found the following problems. Regardless of the charging situation, the discharging situation is explained here. FIG. 2 shows the relation between SOC and OCV (SOC-OCV characteristic), along with the variation of a battery voltage $V_{BAT}$.

For the case of a lithium ion cell, OCV=4.2V in a fully-charged state where SOC=100%. If the minimum voltage for the system containing the load 508 to operate is $V_{BAT\_MIN}$, then SOC=0% when OCV drops to $V_{BAT\_MIN}$. Every SOC value during the process (100% to 0%) has a corresponding OCV value.

As the arrows indicate in FIG. 2, OCV decreases from the fully-charged state as the load current $I_{LOAD}$ flows continuously or discontinuously. The discharging current $I_{BAT}$ is integrated to deliver the coulomb count value CC. SOC is calculated based on the coulomb count value CC, and approaches zero as time elapses.

FIG. 2 also shows a battery voltage $V_{BAT}$ measured from outside the battery 502. The battery voltage $V_{BAT}$ is lower than the OCV. This drop amount (voltage drop) $V_{DROP}$ includes a component proportional to the present load current $I_{LOAD}$ (that is, the instantaneous value) and a component based on the history of the past load current $I_{LOAD}$. Therefore, even after the load current $I_{LOAD}$ becomes zero, $V_{DROP}$ does not immediately become zero. The voltage drop $V_{DROP}$ approaches zero after a long relaxation time (on the order of several hours) in a no-load state.

As shown in FIG. 2, due to the voltage drop $V_{DROP}$, the battery voltage $V_{BAT}$ drops to $V_{BAT\_MIN}$ and the system is shut down before the OCV drops to $V_{BAT\_MIN}$. At such time, the SOC calculated based on the coulomb count method is a value X greater than 0. Thus, the user of the electronic device 500 encounters a situation in which the system shuts down even though the remaining capacity X (%) is displayed.

The present invention has been made in view of the above problems, and one purpose of the present invention is to provide a method and a remaining capacity detection circuit capable of improved accuracy regarding battery remaining capacity detection.

Technical Means for Solving Problems

One embodiment of the present invention relates to a method of detecting SOC (State Of Charge) of a rechargeable battery. This method includes the following processes.
(1) A coulomb count value CC is generated by integrating the charge and discharge currents of the battery.
(2) An SOC value SOC1 is set to:

$$SOC1=(CC_{FULL}-CC)/CC_{FULL} \times 100 \quad (1)$$

where $CC_{FULL}$ is a coulomb count capacity value corresponding to a full charge.

Further, in this method, the following correction processes (3) are performed.
(3-1) A value OCV1 of the OCV (Open Circuit Voltage) corresponding to the value SOC1 is generated based on a relation between SOC and OCV (SOC-OCV characteristic) defined in advance for the battery.
(3-2) A value $V_{BAT1}$ of the battery voltage is detected.
(3-3) A voltage drop $V_{DROP1}$ between OCV1 and $V_{BAT1}$ is generated.
(3-4) A value OCV2, which is ΔV higher than the minimum operating voltage $V_{BAT\_MIN}$ of the system, is generated. ΔV is a voltage width corresponding to the voltage drop $V_{DROP1}$.
(3-5) Based on the SOC-OCV characteristic, a value SOC2 of the SOC corresponding to the value OCV2 is generated.
(3-6) At least one of the values SOC1, CC, $C_{FULL}$, and SOC-OCV characteristic is corrected assuming that the value SOC2 corresponds to the remaining capacity equaling zero (0%).

This embodiment can improve the SOC detection accuracy by correcting the remaining capacity detection process based on the coulomb count method. The correction takes the real-time change of the voltage drop $V_{DROP}$ into consideration and sets the SOC to zero when the actual battery voltage $V_{BAT}$ drops to the minimum operating voltage $V_{BAT\_MIN}$, that is, when the system shuts down.

ΔV can be equal to $V_{DROP1}$. This is effective when the SOC dependency of the voltage drop between the OCV and the battery voltage is small.

The SOC dependency of the voltage drop $V_{DROP}$ between the OCV and the battery voltage may be maintained in advance in a lookup table or as an arithmetic expression.

The correction processing may further include the following processes:
An OCV provisional value $OCV3=V_{BAT\_MIN}+V_{DROP1}$ is calculated.
An SOC provisional value SOC3 corresponding to the OCV provisional value OCV3 is generated.
The voltage drop ΔV at the provisional value SOC3 is calculated based on the voltage drop $V_{DROP1}$ at the value SOC1 and the SOC dependency of the voltage drop. This processing can improve accuracy.

In addition to the SOC dependency of the voltage drop $V_{DROP}$, temperature dependency may be maintained. This can further improve accuracy.

During the correction process (3-6), the coulomb count capacity value $CC_{FULL}$ may be modified to a new value $CC_{FULL}'$ obtained by the following equation (2):

$$CC_{FULL}'=CC_{FULL} \times (100-SOC2)/100 \quad (2)$$

In the correction process (3-6), the coulomb count value CC may be modified to a new value CC' obtained by the following equation (3):

$$CC'=CC-(CC_{FULL}-CC_{FULL}') \quad (3)$$

In the correction process (3-6), the coulomb count value CC may be modified to a new value CC' obtained by the following equation (4):

$$CC'=CC-CC_{FULL} \times SOC2/100 \quad (4)$$

In the correction processing (3-6), the new value SOC' obtained by the following equation (5) may be used as a corrected SOC:

$$SOC'=SOC1 \times 100/(100-SOC2) \quad (5)$$

In the correction process (3-6), the coulomb count value CC need not be modified.

In the correction process (3-6), a new value SOC obtained by the following equation (6) may be used as a corrected SOC:

$$SOC'=\{CC_{FULL}-CC \times 100/(100-SOC2)\}/CC_{FULL} \times 100 \quad (6)$$

In the correction process (3-6), the coulomb count value CC may be modified to a new value CC' obtained by the following equation (7) without correcting the coulomb count capacity value $CC_{FULL}$:

$$CC'=CC \times 100/(100-SOC2) \quad (7)$$

In the correction process (3-6), the coulomb count value CC may be modified to a new value CC' obtained by the following equation (8):

$$CC'=CC \times (100-SOC2)/100 \quad (8)$$

In the SOC-OCV characteristic described above, the range of the OCV lower than the minimum operating voltage of the system may be associated with negative SOC values. Thus, it can deal with cases where the effective remaining capacity increases.

The correction process (3) may be enabled when the voltage of the battery is lower than a predetermined voltage value. Alternatively, the correction process (3) may be enabled when the SOC is lower than a predetermined value. By not performing the correction process when the battery remaining capacity is large, it is possible to suppress an increase in power consumption due to the correction process.

The correction process (3) may be enabled intermittently at a predetermined interval. When the correction process is always enabled, power consumption increases. Intermittently performing the correction process at a predetermined interval can suppress an increase in power consumption due to the correction process.

The predetermined interval may be longer than 1 second and shorter than 60 seconds. Performing the correction process at this interval can improve the accuracy of SOC sufficiently within a range of reasonable power consumption increase.

Another embodiment of the present invention relates to a remaining capacity detection circuit for detecting SOC (State Of Charge) of a rechargeable battery. The remaining capacity detection circuit includes a coulomb counter circuit for generating a coulomb count value CC by integrating charging and discharging currents of the battery, a voltage detection circuit for detecting a battery voltage $V_{BAT}$, an SOC calculator for calculating an SOC value SOC1, and a correction circuit for correcting at least one of the values SOC1, CC, $CC_{FULL}$ and SOC-OCV characteristic:

$$SOC1 = (CC_{FULL} - CC)/CC_{FULL} \times 100 \quad (1)$$

where $CC_{FULL}$ is the coulomb count capacity value corresponding to full charge.

The correction circuit performs the following processes:
a step of generating an OCV value OCV1 corresponding to the value SOC1 on the basis of an SOC-OCV characteristic which is a relationship between SOC and OCV predetermined for the battery;
a step of generating a voltage drop $V_{DROP1}$ between the value OCV1 and a voltage $V_{BAT1}$ detected by the voltage detection circuit;
a step of generating a value OCV2 which is higher than the minimum operating voltage of the system by a voltage width $\Delta V$ corresponding to the voltage drop $V_{DROP1}$; and
a step of generating an SOC value SOC2 corresponding to the value OCV2 based on the SOC-OCV characteristic;
a step of correcting at least one of the values SOC1, CC, $CC_{FULL}$, and SOC-OCV characteristic assuming that the value SOC2 corresponds to the remaining capacity equaling zero (0%).

Another embodiment of the present invention is an electronic device. The electronic device includes a rechargeable battery and the above-described remaining capacity detection circuit for detecting the state of the battery.

Another embodiment of the present invention is an automobile. An automobile includes a rechargeable battery and the above-described remaining capacity detection circuit for detecting the state of the battery.

It is to be noted that any combination of the above constituent elements and mutual substitution of constituent elements and expressions of the present invention among methods, apparatuses, systems, etc. are also effective as embodiments of the present invention.

Effects of the Present Invention

The present invention can improve the detection accuracy of the state of charge of a battery.

BRIEF DESCRIPTION OF THE DRAWINGS

FIG. 4 shows an example of an SOC-OCV characteristic.
FIG. 12 is a look-up table showing the SOC dependency of the voltage drop VDROP.
FIG. 16 shows an extended VDR look-up table.

DETAILED DESCRIPTION

Figure 1:
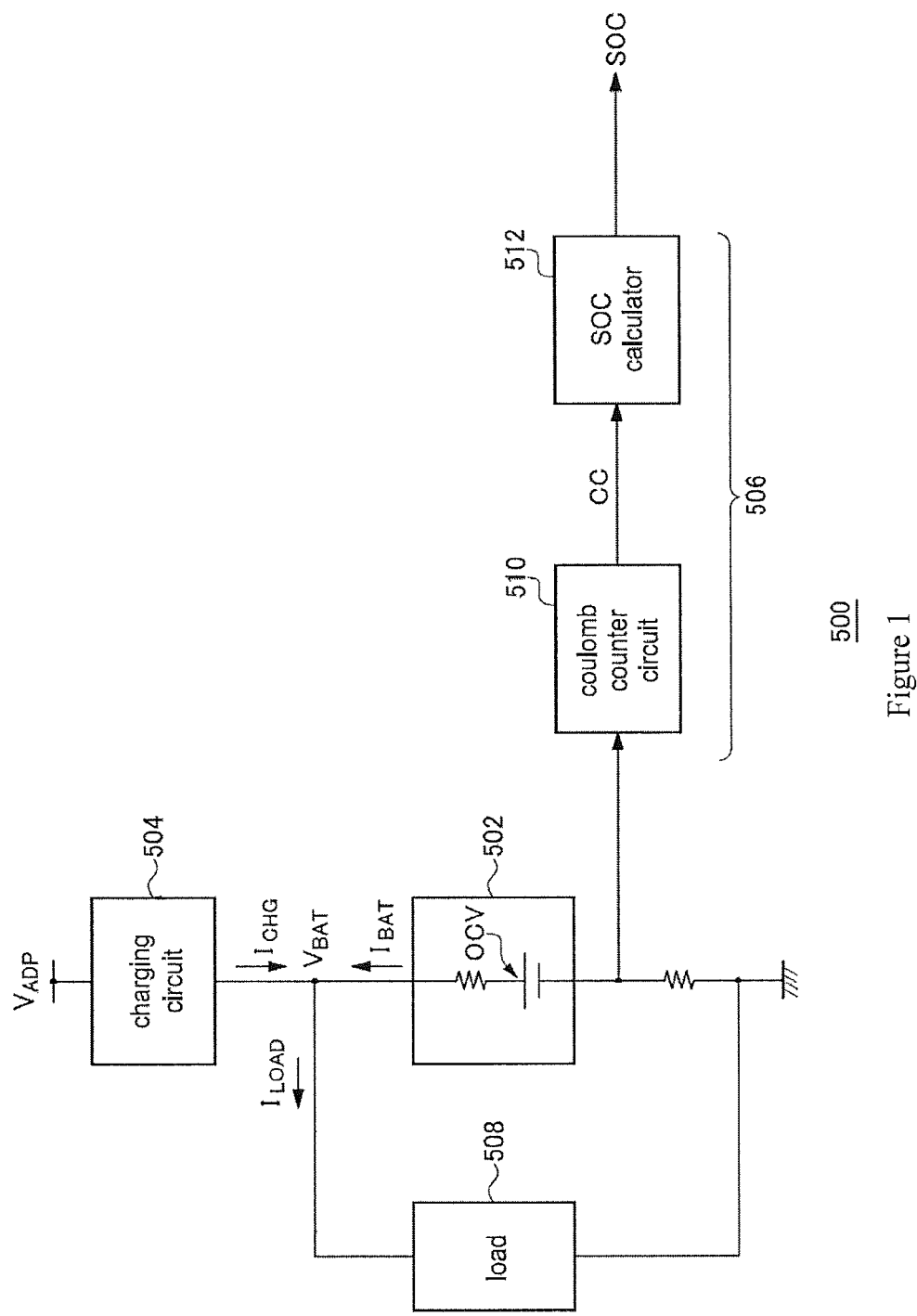
FIG. 1 is a block diagram of an electronic device.

Hereinafter, the present invention will be described with reference to the drawings based on preferred embodiments. Identical or equivalent constituent elements, members, and processes shown in the drawings are denoted by the same reference numerals, and redundant descriptions are omitted as appropriate. In addition, the embodiments are merely examples that do not limit the invention. All the features described in the embodiments and combinations thereof are not necessarily essential to the invention.

In the present specification, "a state where a member A is connected to a member B" means that the member A and the member B are physically directly connected, or the member A and the member B are indirectly connected via other members which do not substantially affect their electrical connection state or which do not impair the function or effect to be exerted by the coupling thereof.

Similarly, "a state where a member C is provided between a member A and a member B" means that the member A and the member C, or the member B and the member C are directly connected to each other, or indirectly connected via other members which do not substantially affect their electrical connection state or which do not impair the function or effect to be exerted by the coupling thereof.

In the present specification, reference numerals attached to voltage signals, current signals, or resistances represent respective voltage values, current values, or resistance values as necessary.

Figure 3:
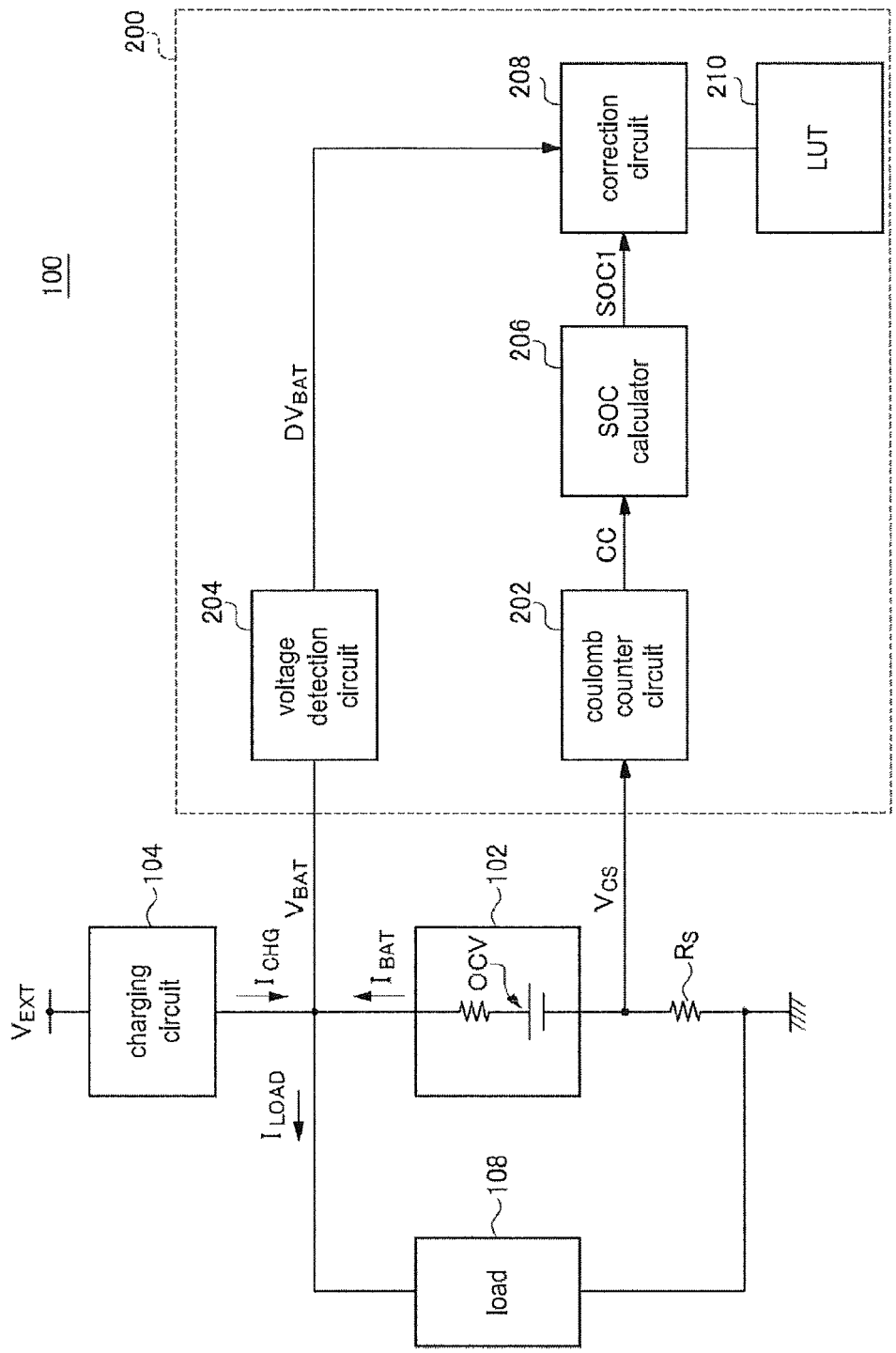
FIG. 3 is a block diagram of a battery management system including a remaining capacity detection circuit according to an embodiment.

FIG. 3 is a block diagram of a battery management system 100 including a remaining capacity detection circuit according to an embodiment. The battery management system 100 includes a battery 102, a charging circuit 104, a load 108, and a remaining capacity detection circuit 200. The battery 102 includes one or a plurality of cells. The type of the cell is not particularly limited, and examples thereof include a lithium ion cell, a lithium air cell, a lithium metal base cell, a nickel hydrogen cell, a nickel cadmium cell, a nickel zinc cell, and the like. The number of cells depends on the application of the battery management system 100. In the case of portable electronic equipment, the number of cells ranges from one cell to several cells, and the number of cells is on the order of tens to hundreds of cells for use in vehicle batteries, industrial equipment, and industrial machinery. The configuration of the battery 102 as an application of the present invention is not particularly limited.

The battery voltage $V_{BAT}$ from the battery 102 is supplied to the load 108. The type of the load 108 is not particularly limited. For example, when the battery management system 100 is mounted in an electronic device, the load 108 may include a power supply circuit for boosting or stepping down the battery voltage $V_{BAT}$ to generate the power supply voltage VDD, and various electronic circuits operating upon receiving the power supply voltage VDD. When the battery management system 100 is mounted on an automobile or an industrial machine, the load 108 may include a motor and an inverter that converts the battery voltage $V_{BAT}$ to an alternating current and drives the motor.

The charging circuit 104 receives a power supply voltage $V_{EXT}$ from an external power adapter, USB (Universal Serial Bus), charging station, etc., and charges the battery 102.

The remaining capacity detection circuit 200 detects a state of charge (SOC) of the battery 102. In the present specification, for ease of understanding, the SOC is described as a percentage (%) having a minimum value of 0 and a maximum value of 100, but the present invention is not limited thereto. For example, when SOC is represented by 10 bits, it should be noted that in the course of digital signal processing, the SOC is represented by 1024 gradations from 0 to 1023.

The remaining capacity detection circuit 200 includes a coulomb counter circuit 202, a voltage detection circuit 204, an SOC calculator 206, a correction circuit 208, and a lookup table 210. The coulomb counter circuit 202 generates a coulomb count value CC by integrating the charge/discharge current ($I_{BAT}$) of the battery 102. The coulomb count value CC is expressed by the following equation:

$$CC = \int I_{BAT} dt$$

The coulomb counter circuit 202 samples the battery current IBAT at a predetermined sampling period Δt. The coulomb count value CC is calculated by the following equation using the battery current $I_{BATi}$ at each sampling time:

$$CC = \Sigma_{i-1}(\Delta t \times I_{BATi})$$

This integration may be performed with the current $I_{BAT}$ flowing out from the battery 102 being positive and the current $I_{BAT}$ flowing into the battery 102 being negative.

The method of detecting the current IBAT is not particularly limited. For example, a sense resistor $R_S$ may be inserted in series with the battery 102 on the path of the current $I_{BAT}$ to detect a voltage drop of the sense resistor $R_S$. The sense resistor RS may be inserted on the positive electrode side of the battery 102 or may be inserted on the negative electrode side. The coulomb counter circuit 202 may include an A/D converter that samples a voltage drop VCS of the sense resistor $R_S$ (or a voltage obtained by amplifying the voltage drop VCS) and an integrator that integrates the output data of the A/D converter.

The voltage detection circuit 204 monitors the voltage $V_{BAT}$ of the battery 102, and generates data (voltage data) $DV_{BAT}$ indicating a value $V_{BAT1}$ of the battery voltage. The voltage detection circuit 204 may include an A/D converter that samples and digitizes the battery voltage $V_{BAT}$ or a voltage obtained by multiplying the battery voltage $V_{BAT}$ by a predetermined factor.

The SOC calculator 206 receives the coulomb count value CC from the coulomb counter circuit 202. Based on Equation (1), the SOC calculator 206 calculates an SOC value SOC1:

$$SOC1 = (CC_{FULL} - CC)/CC_{FULL} \times 100 \qquad (1)$$

where $CC_{FULL}$ is a coulomb count capacity value corresponding to full charge.

The value SOC1 and the voltage data $DV_{BAT}$ are supplied to the correction circuit 208. Based on these values, the correction circuit 208 corrects at least one of the values SOC1, CC, $CC_{FULL}$, and the SOC-OCV characteristic.

Correction processing by the correction circuit 208 is described below. With respect to the battery 102, a relation between SOC and OCV (SOC-OCV characteristic) is measured in advance. FIG. 4 shows an example of the SOC-OCV characteristic. The SOC-OCV characteristic may be stored in the look-up table 210 of FIG. 3. An intermediate value not stored in the look-up table 210 can be generated by arithmetic means such as linear interpolation. Alternatively, the correction circuit 208 may hold the SOC-OCV characteristic in the form of an arithmetic expression (for example, a polynomial).

The correction circuit 208 generates an OCV value OCV1 corresponding to the value SOC1 based on the SOC-OCV characteristic, and also generates a voltage drop $V_{DROP1}$ between OCV1 and the voltage value $V_{BAT1}$ detected by the voltage detection circuit 204:

$$V_{DROP1} = OCV1 - V_{BAT1}$$

Let $V_{BAT\_MIN}$ be the minimum operating voltage of the system including the load 108. The correction circuit 208 generates a value OCV2 which is higher than the minimum operating voltage $V_{BAT\_MIN}$ by a voltage width ΔV corresponding to the voltage drop $V_{DROP1}$:

$$OCV2 = V_{BAT\_MIN} + \Delta V$$

If $\Delta V = V_{DROP1}$ $$OCV2 = V_{BAT\_MIN} + V_{DROP1}$$

If $\Delta V = V_{DROP1} \times \alpha$ (α is a constant), then:

$$OCV2 = V_{BAT\_MIN} + V_{DROP1} \times \alpha$$

If $\Delta V = V_{DROP1} + \beta$ (β is a constant), then:

$$OCV2 = V_{BAT\_MIN} + V_{DROP1} \times \beta$$

Alternatively, $$OCV2 = V_{BAT\_MIN} + \alpha \times V_{DROP1} + \beta$$

may be used. More generally, a function f( ) may be defined and the voltage width ΔV may be calculated based on $\Delta V = f(V_{DROP1})$.

The correction circuit 208 generates an SOC value SOC2 corresponding to OCV 2 based on the SOC-OCV characteristic. Then, the correction circuit 208 corrects at least one of the values SOC1, CC, CCFULL, and SOC-OCV characteristic assuming that the value SOC2 corresponds to the remaining capacity of the battery 102 equaling zero (0%).

The coulomb counter circuit 202 and the voltage detection circuit 204 can be implemented with only hardware, and they may be integrated into a single IC. The SOC calculator 206, the correction circuit 208, and the look-up table 210 may be implemented by a software controllable processor such as a microcomputer. Alternatively, the entire remaining capacity detection circuit 200 may be integrated on a single chip.

The SOC generated by the remaining capacity detection circuit 200 is displayed on a display device as a numeral or as an icon indicating the remaining capacity, or is used as an alert.

Figure 5:
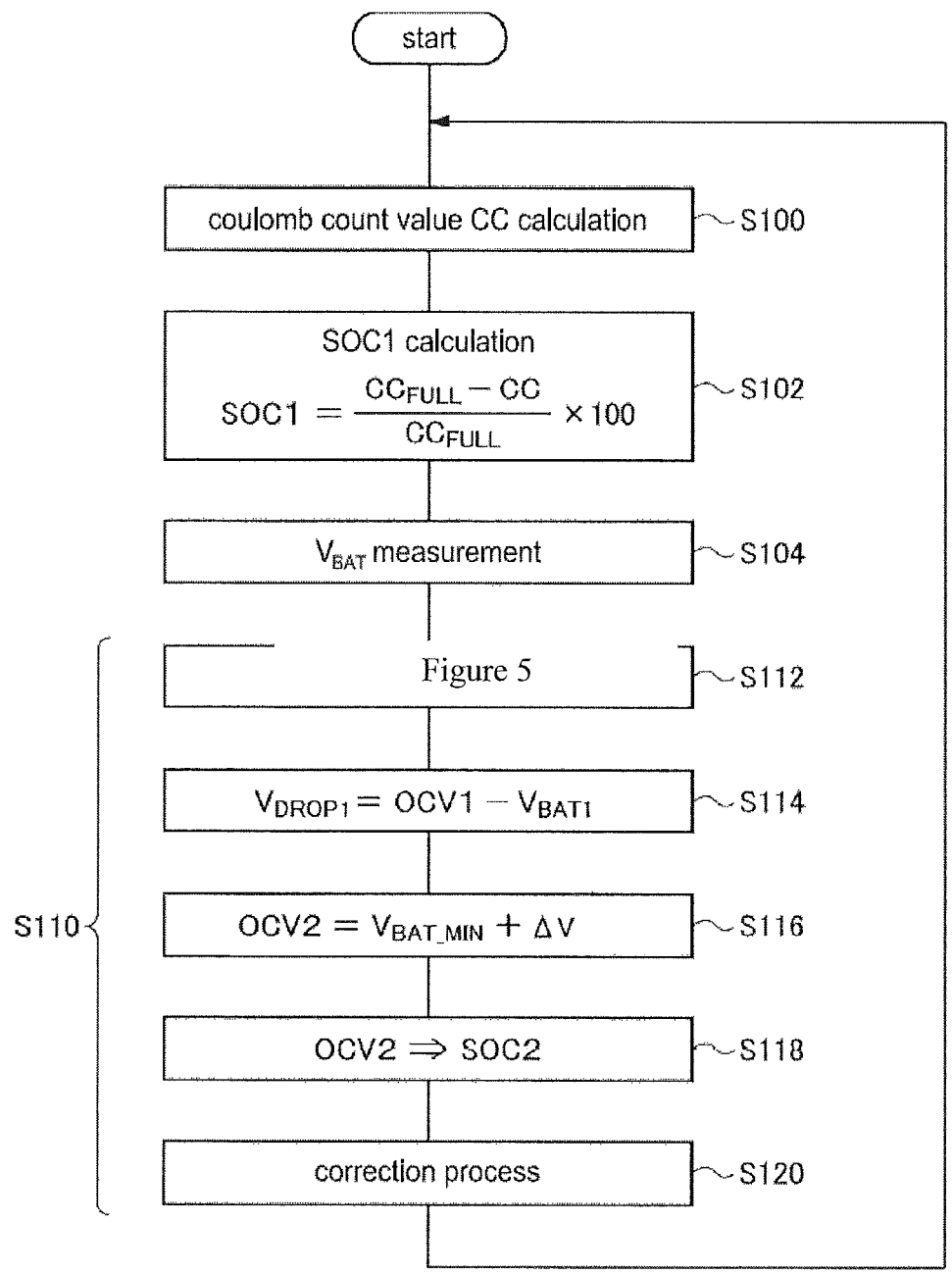
FIG. 5 is a flowchart of remaining capacity detection according to an embodiment.

The above is a configuration of the remaining capacity detection circuit 200 according to an embodiment. Next, the operation will be explained. FIG. 5 is a flowchart of remaining capacity detection according to the embodiment. For example, the processing starts from a fully charged state. It should be noted that the flowchart does not limit the order of each process, and the order of each process can arbitrarily be changed as long as the whole processing does not fail.

Further, this flowchart does not show that the frequency or interval at which each process is performed is the same.

The coulomb counter circuit 202 calculates a coulomb count value CC (S100). The SOC calculator 206 calculates a value SOC1 based on Equation (1) using the coulomb count value CC (S102). For example, the coulomb counter 202 may update the coulomb count value CC at a frequency of tens to hundreds of Hz, while the SOC calculator 206 may calculate SOC1 at a lower frequency, for example, at an interval of about 1 second to 60 seconds.

The voltage detection circuit 204 measures $V_{BAT}$ (S104). When an increase in power consumption does not cause a problem, the voltage detection circuit 204 may measure the battery voltage $V_{BAT}$ at a high frequency (for example, the same frequency as that of the coulomb counter circuit 202).

Figure 6:
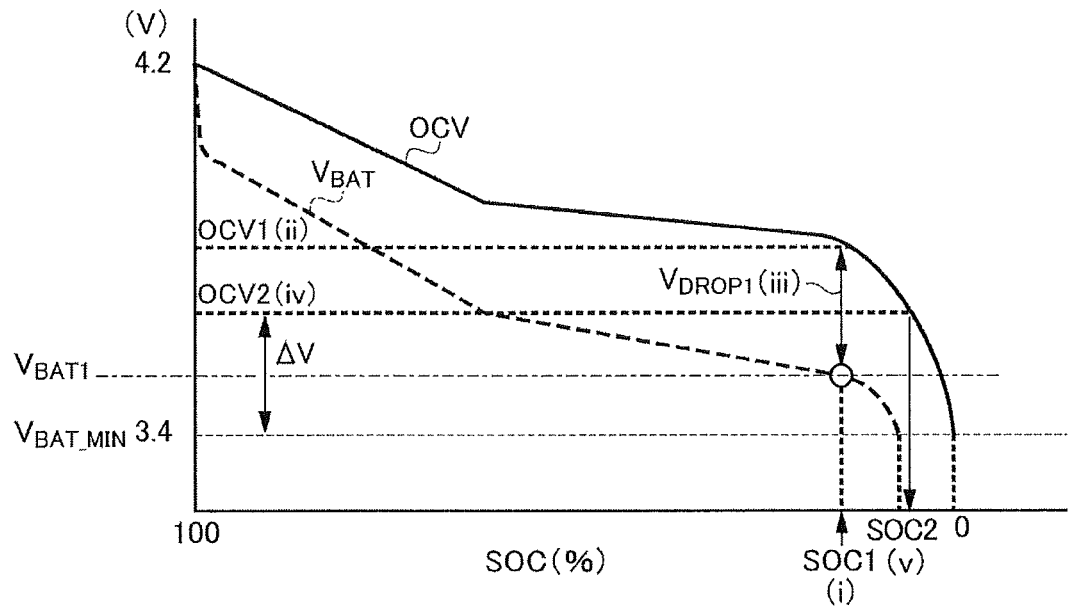
FIG. 6 shows a correction process using a relationship between voltage and SOC.

Next, correction process S110 is performed. The correction process S110 may be performed for each calculation of the SOC1, or may be performed with a lower frequency. FIG. 6 shows a correction process S110 using an SOC-OCV characteristic. Each value is generated in the order of the numbers (i) to (v) attached to it.

The correction circuit 208 converts SOC1 to OCV1 based on the SOC-OCV characteristic (S112). Subsequently, a voltage drop $V_{DROP1}$ is calculated (S114). Next, based on the voltage drop $V_{DROP1}$ and a minimum operating voltage $V_{BAT\_MIN}$, an OCV2 corresponding to the OCV when a measured value $V_{BAT1}$ of the battery voltage $V_{BAT}$ reaches the minimum operating voltage $V_{BAT\_MIN}$ is estimated (S116). Then, based on the SOC-OCV characteristic, inverse conversion is performed from the value OCV2 to an SOC value SOC2 corresponding to the value OCV2 (S118).

The value SOC2 represents the SOC at which the system may shut down. That is, when the SOC1 calculated by the SOC calculator 206 decreases to the value SOC2, it indicates that there is a possibility that the battery voltage $V_{BAT}$ is reduced to the minimum operation voltage $V_{BAT\_MIN}$ and system shuts down.

Therefore, in the correction process S120, based on the value SOC2, at least one of the values SOC1, CC, $CC_{FULL}$, and SOC-OCV characteristic is corrected assuming that the value SOC2 corresponds to the remaining capacity equaling zero (0%).

The above is the remaining capacity detection process according to an embodiment. According to the remaining capacity detection circuit 200 (and the remaining capacity detecting method) described herein, the time-varying voltage drop $V_{DROP}$ is taken into consideration. Thus the remaining capacity detection process based on the coulomb count method can be corrected so that the SOC becomes zero when the actual battery voltage $V_{BAT}$ drops to the minimum operating voltage $V_{BAT\_MIN}$, that is, when the system shuts down. Thus the SOC detection accuracy can be improved.

The remaining capacity detecting method according to the embodiment should not be confused with the SOC based on a voltage method. This embodiment is common to the voltage method in using the SOC-OCV characteristic, but does not require the process of measuring OCV, so it is not necessary to wait for the elapse of the relaxation time.

The present invention extends to various apparatuses, circuits, systems, and methods that are grasped as the block diagram of FIG. 3 or the flowchart of FIG. 5, or derived from the above description. The present invention is not limited to any particular configuration or method. In the following, rather than narrowing the scope of the present invention, a more specific configuration and method will be described in order to aid understanding of the essence of the invention and circuit operation.

Subsequently, the correction process S120 in the flowchart of FIG. 5 will be described. There are various methods for the correction process as described below.

Figure 7:
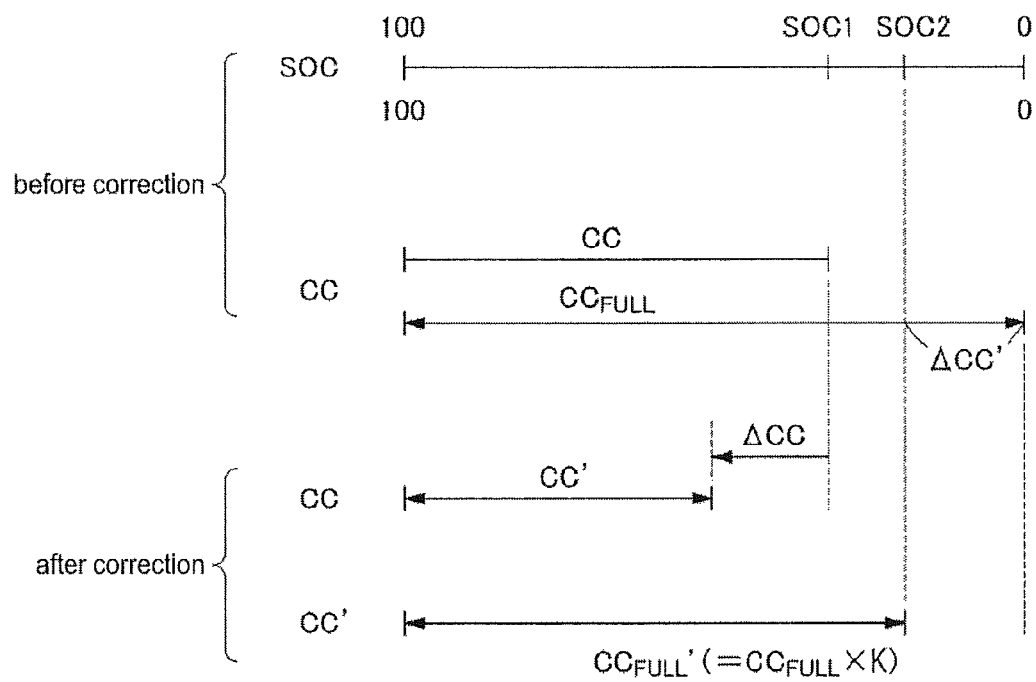
FIG. 7 schematically shows a first correction method.

(First correction method) FIG. 7 is a diagram schematically showing a first correction method. The coulomb count capacity value $CC_{FULL}$ is corrected to a new value $CC_{FULL}'$ obtained by Equation (2):

$$CC_{FULL}'=CC_{FULL} \times (100-SOC2)/100 \quad (2)$$

That is, $CC_{FULL}$ is scaled so that SOC2 equals a remaining capacity of zero (SOC=0%). Letting K=(100−SOC2)/100 be a scaling factor, Equation (2) can be rewritten to equation (2'):

$$CC_{FULL}'=CC_{FULL} \times K \quad (2')$$

In addition, the coulomb count value CC is corrected to a new value CC' obtained by Equation (3):

$$\begin{aligned}CC' &= CC - (CC_{FULL} - CC'_{FULL}) \\ &= CC - CC_{FULL} \times SOC2/100\end{aligned} \quad (3)$$

That is, the reduced amount $\Delta CC$ ($=CC_{FULL}-CC_{FULL}'$) from $CC_{FULL}$ by correction is also reduced from CC.

The corrected coulomb count value CC' is written in a register for storing the coulomb count value CC inside the coulomb counter circuit 202 in FIG. 3. In addition, the coulomb count capacity value $CC_{FULL}'$ is replaced with the coulomb count capacity value $CC_{FULL}$ held by the SOC calculator 206 in FIG. 3.

The coulomb count value CC may be corrected to a new value CC' obtained by Equation (4):

$$CC'=CC-CC_{FULL} \times SOC2/100 \quad (4)$$

Equation (3) is equivalent to Equation (4).

After CC and $CC_{FULL}$ are corrected, an SOC1' generated by the SOC calculator 206 thereafter is expressed by the following equation:

$$\begin{aligned}SOC1' &= (CC'_{FULL} - CC')/CC'_{FULL} \times 100 \\ &= \{(CC_{FULL} - CC_{FULL} \times SOC2/100) - \\ &\quad (CC - CC_{FULL} \times SOC2/100)\}/ \\ &\quad \{CC_{FULL} \times K\} \times 100 \\ &= (CC_{FULL} - CC)/CC_{FULL} \times 100 \times 1/K\end{aligned}$$

Since $(CC_{FULL}-CC)/CC_{FULL} \times 100$ corresponds to SOC1 in Equation (1), the corrected SOC' is expressed by Equation (5):

$$\begin{aligned}SOC' &= SOC1 \times 1/K \\ &= SOC1 \times 100/(100-SOC2)\end{aligned} \quad (5)$$

In the first correction method, the coulomb count value CC and the coulomb count capacity value $CC_{FULL}$ are corrected by one correction, and thereafter the charge/discharge current $I_{BAT}$ is integrated with the corrected coulomb count value CC' as an initial value. That is, the SOC detection by the coulomb count method is performed while the correction is reflected. That is, it is not always necessary to perform the correction process of the correction circuit 208 every time the SOC calculation is performed by the SOC calculator 206.

(Second correction method) The second correction method is substantially the same as the first correction method, but does not modify the values CC and $CC_{FULL}$. In the second correction method, the value SOC' calculated based on Equation (5) is set as the improved SOC after correction. The second correction method can be used when performing the correction process every time the SOC calculator 206 calculates SOC1.

(Third correction method) In the third correction method, $CC_{FULL}$ is corrected based on Equation (2), while the coulomb count value CC is not corrected.

In the third correction method, a new value SOC' obtained by Equation (6) is used as the corrected SOC:

$$SOC' = (CC'_{FULL} - CC)/CC'_{FULL} \times 100 \quad (6)$$
$$= CC_{FULL} \times K - CC)/(CC_{FULL} \times K) \times 100$$
$$= (CC_{FULL} - CC \times 1/K)/CC_{FULL} \times 100$$
$$= \{CC_{FULL} - CC \times 100/(100 - SOC2)\}/CC_{FULL} \times 100$$

(Fourth correction method) In the fourth correction method, the coulomb count value CC may be corrected to a new value CC' obtained by Equation (7) without correcting the coulomb count capacity value $CC_{FULL}$:

$$CC' = CC \times 100/(100 - SOC2) \quad (7)$$

The fourth correction method is equivalent to the third correction method because it gives the same SOC' as the third correction method.

(Fifth correction method) In the fifth correction method, the coulomb count capacity value $CC_{FULL}$ is corrected based on Equation (2). Further, the coulomb count value CC is corrected to a new value CC' obtained by Equation (8). That is, $CC_{FULL}$ and CC are scaled with the same scaling factor K:

$$CC' = CC \times (100 - SOC2)/100 \quad (8)$$
$$= CC \times K$$

In the fifth correction method, an SOC immediately after the correction is computed by the following equation:

$$SOC' = (CC'_{FULL} - CC)/CC'_{FULL} \times 100$$
$$= (CC_{FULL} \times K - CC \times K)/(CC_{FULL} \times K) \times 100$$
$$= (CC_{FULL} - CC)/CC_{FULL} \times 100$$
$$= SOC1$$

Thus, the SOC immediately after the correction is the same as just before the correction. However, since the coulomb count value CC and the coulomb count capacity value $CC_{FULL}$ are corrected, SOC1, which is calculated thereafter as the counting continues, reflects the correction. In the case where discontinuity of SOC is not preferable, it is preferable to adopt the fifth correction method.

(Sixth correction method) In the first to fifth correction methods, at least one of the values CC, $CC_{FULL}$, and SOC is corrected. In contrast, in the sixth correction method, the SOC-OCV characteristic is corrected. More specifically, in the sixth correction method, the SOC-OCV characteristic is corrected such that SOC2 becomes zero (0%). For example, if SOC (%) stands for a pre-correction SOC and SOC (%) stands for a post-correction SOC, then:

$$SOC' = 100 - (100 - SOC) \times 1/K \quad (9)$$
$$= 100 - (100 - SOC) \times 100/(100 - SOC2)$$

Figure 8:
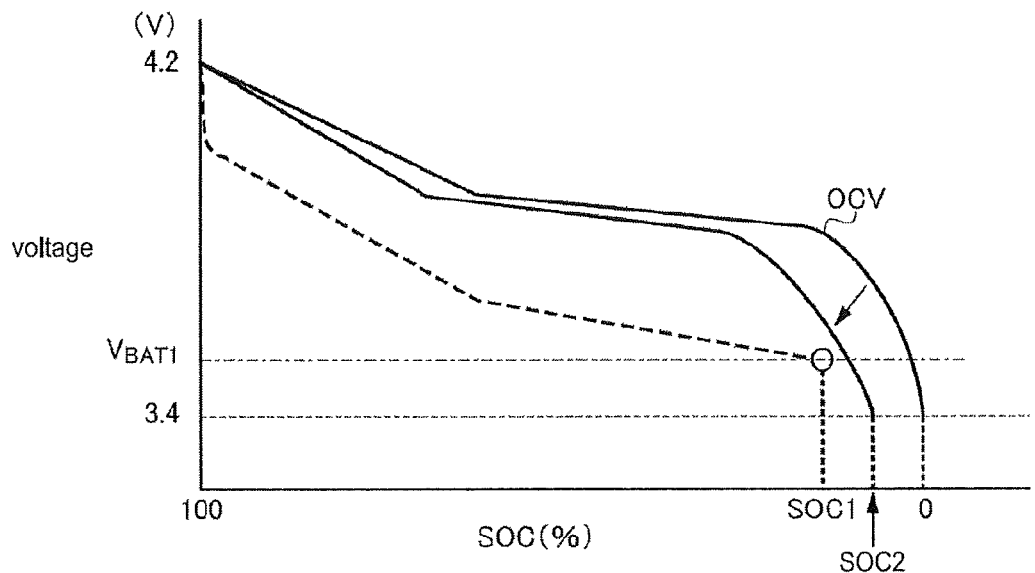
FIG. 8 shows an example of correction of an SOC-OCV characteristic.
Figure 9:
FIG. 9 shows an example of correction of an SOC-OCV characteristic.

FIGS. 8 and 9 are diagrams showing an example of correction of the SOC-OCV characteristic.

The sixth correction method is not limited to the method described above, and an arithmetic equation different from the equation (9) may be used. Alternatively, instead of correcting the SOC value, the value of the OCV corresponding to each SOC may be corrected, or both of them may be corrected. For the correction of the SOC-OCV characteristic, there may be variations corresponding to the first to fifth correction methods described above.

Some variations of the correction method have been described above. Those skilled in the art will appreciate that various correction methods exist in addition to the first to sixth correction methods and that various correction methods are included in the scope of the present invention.

The correction method to be adopted may be selected according to the application of the battery management system 100. For example, in the first and second correction methods, when K<1, the SOC value increases by correction. Alternatively, in the third and fourth correction methods, when K<1, the SOC value decreases by correction. In the fifth correction method, the SOC value is maintained before and after the correction. K<1 represents an absolute decrease in the remaining capacity. SOC, on the other hand, indicates the relative remaining capacity. From the viewpoint of a relative remaining capacity, it can be said that the first and second correction methods are correct. However, many users do not regard the SOC displayed as % as a relative remaining capacity, instead regarding it as an absolute remaining capacity. In this case, users will feel uncomfortable with increasing SOC (%) while the remaining capacity is decreasing (that is, while the remaining usable time is decreasing). In this case, the third to fifth correction methods may be used.

The present invention has been described above based on some embodiments. Those skilled in the art will appreciate that these embodiments are examples and that several variations can be made to the combination of each component and each process of these embodiments, and that such variations are also within the scope of the present invention. Accordingly, some variation examples will be described.

Figures 10, 11:
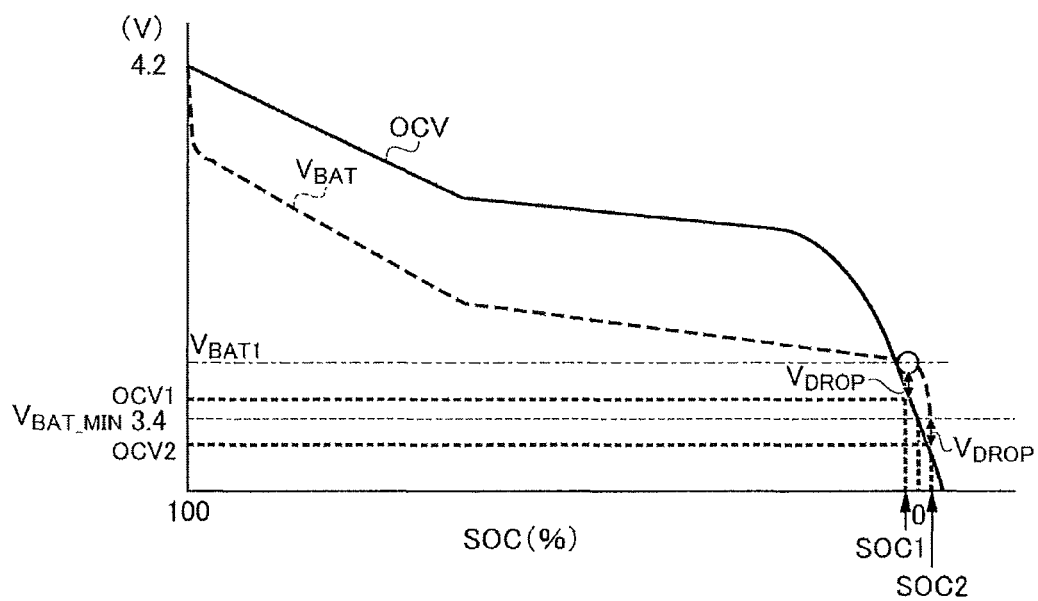
FIG. 10 shows an example of an SOC-OCV characteristic in the first variation.
FIG. 11 shows a correction process using the SOC-OCV characteristic of FIG. 10.

(First variation) In the SOC-OCV characteristic, a range of OCV lower than the minimum operating voltage of the system may be associated with negative SOC values. FIG. 10 shows an example of the SOC-OCV characteristic in the first variation. The above example provided a description of the case where there is a decrease in the battery's effective remaining capacity (absolute value). However, when the voltage drop VDROP becomes negative, the remaining capacity increases. Introducing a negative SOC value can deal with cases where the effective remaining capacity increases without any other special process. FIG. 11 shows a correction process using the SOC-OCV characteristic of FIG. 10.

(Second variation) In process S116 in the flowchart of FIG. 5, the following equation is used to generate OCV2:

$$OCV2 = V_{BAT\_MIN} + \Delta V \quad (10)$$

Figure 2:
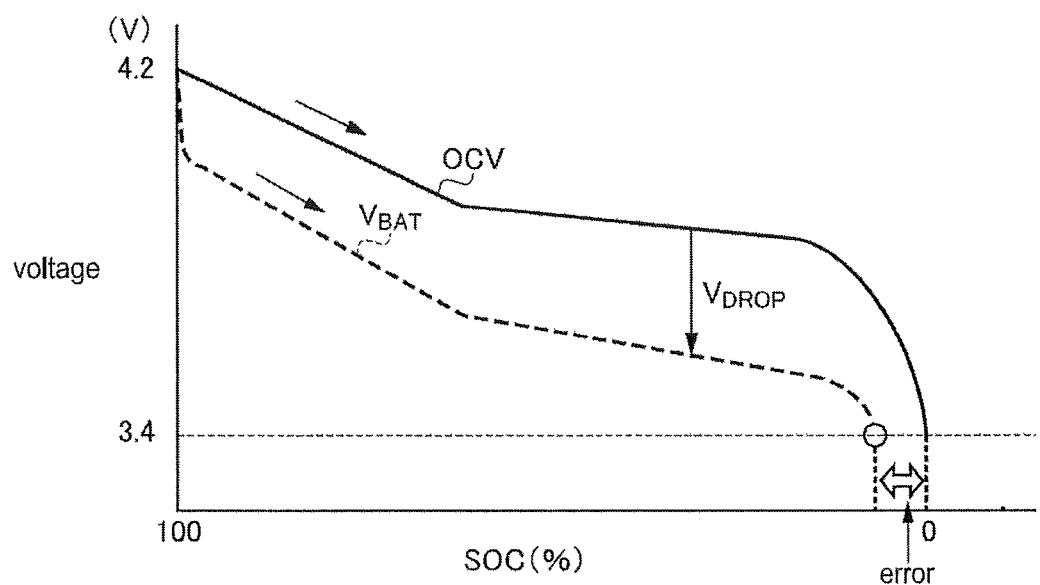
FIG. 2 shows the relation between SOC and OCV (SOC-OCV characteristic), along with the variation of a battery voltage $V_{BAT}$.

As shown in FIG. 2, the voltage drop $V_{DROP}$ between OCV and $V_{BAT}$ depends on SOC. Therefore, when $\Delta V = V_{DROP1}$ is used in the process S116, the error increases when the difference between SOC1 and SOC2 is large.

Therefore, in a second variation, the SOC dependency of the voltage drop $V_{DROP}$ is taken into consideration. Specifically, the SOC dependency of the voltage drop $V_{DROP}$ is defined in a look-up table or as an arithmetic expression. FIG. 12 is a look-up table showing the SOC dependency of the voltage drop $V_{DROP}$. This table represents relative ratios of voltage drops corresponding to different SOC values. For example, a voltage drop at each SOC is set as a ratio (Voltage Drop Ratio: VDR) with reference to a voltage drop at a predetermined reference SOC (100% in this example):

$$VDR(x) = V_{DROP}(x)/V_{DROP}(100)$$

Therefore, when the voltage drop at one SOC (=x 1) is $V_{DROP1}$, the voltage drop $V_{DROP2}$ at another SOC (=x 2) can be calculated using the following equation:

$$V_{DROP2} = V_{DROP1} \times VDR(x_2)/VDR(x_1)$$

Figure 13:
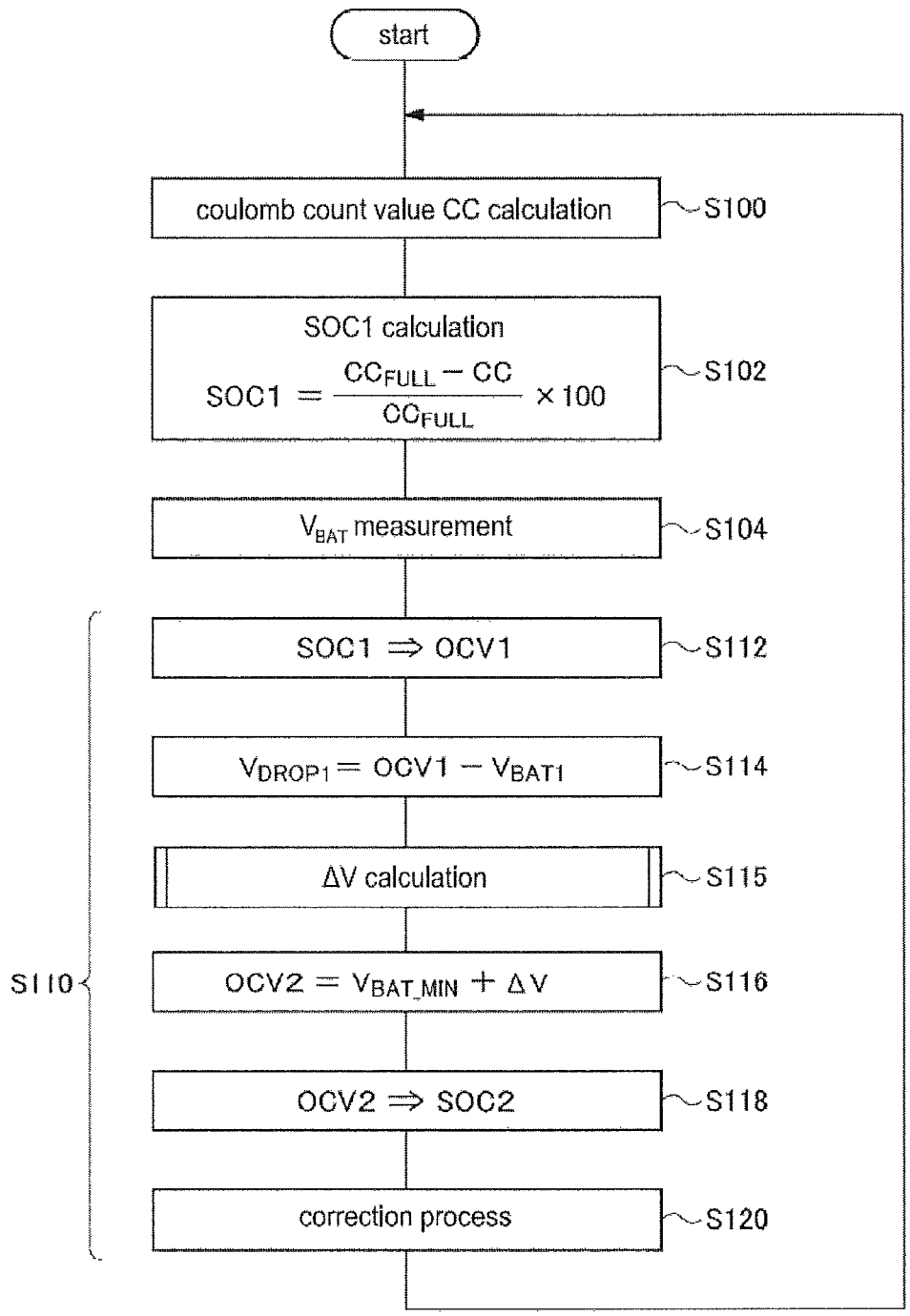
FIG. 13 is a flowchart of remaining capacity detection according to a second variation.
Figure 14:
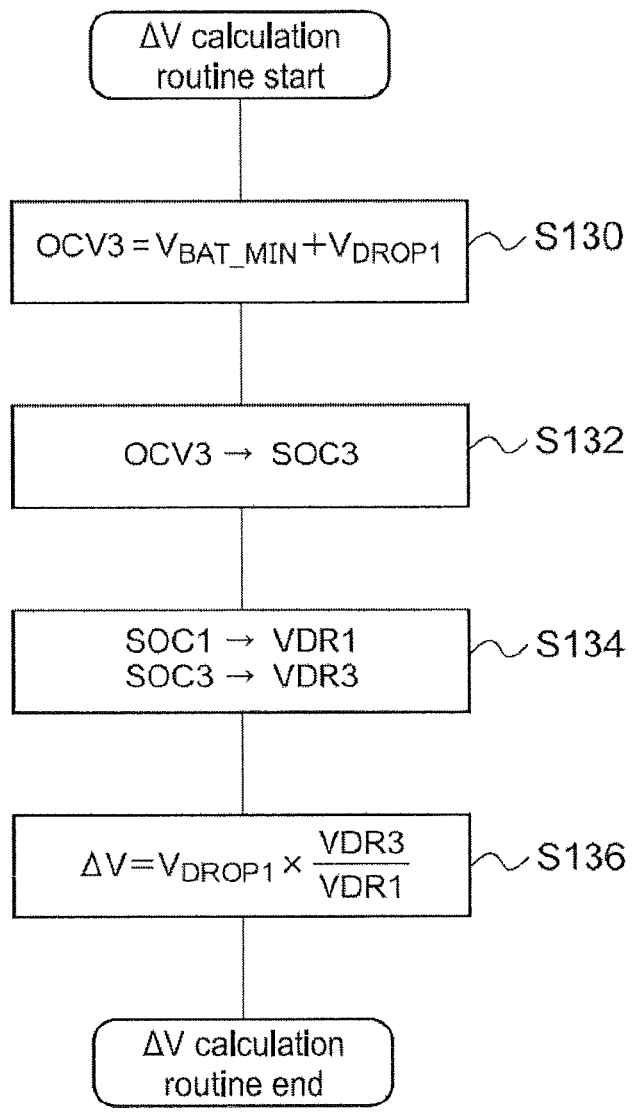
FIG. 14 is a flowchart showing a $\Delta V$ calculation routine of FIG. 13.

FIG. 13 is a flowchart of remaining capacity detection according to the second variation. In this flowchart, a $\Delta V$ calculation routine S115 is added before the process S116 in the flowchart of FIG. 5. FIG. 14 is a flowchart showing the $\Delta V$ calculation routine S115.

First, based on the voltage drop $V_{DROP1}$ and the minimum operating voltage $V_{BAT\_MIN}$, a provisional value OCV3 of the OCV when the measured voltage value $V_{BAT1}$ reaches the minimum operating voltage $V_{BAT\_MIN}$ is calculated (S130):

$$OCV3 = V_{BAT\_MIN} + V_{DROP1}$$

Next, based on the SOC-OCV characteristic, an inverse conversion is performed from the provisional value OCV3 to an SOC value SOC3 corresponding thereto (S132).

Subsequently, VDR values VDR1 and VDR3 corresponding to SOC1 and SOC3 are acquired based on the lookup table of FIG. 12 (S134). Then, $\Delta V$ is calculated based on the following equation (S136):

$$\Delta V = V_{DROP1} \times VDR3/VDR1$$

By using $\Delta V$ thus obtained, OCV2 is calculated in process S116 of FIG. 13.

Figure 15:
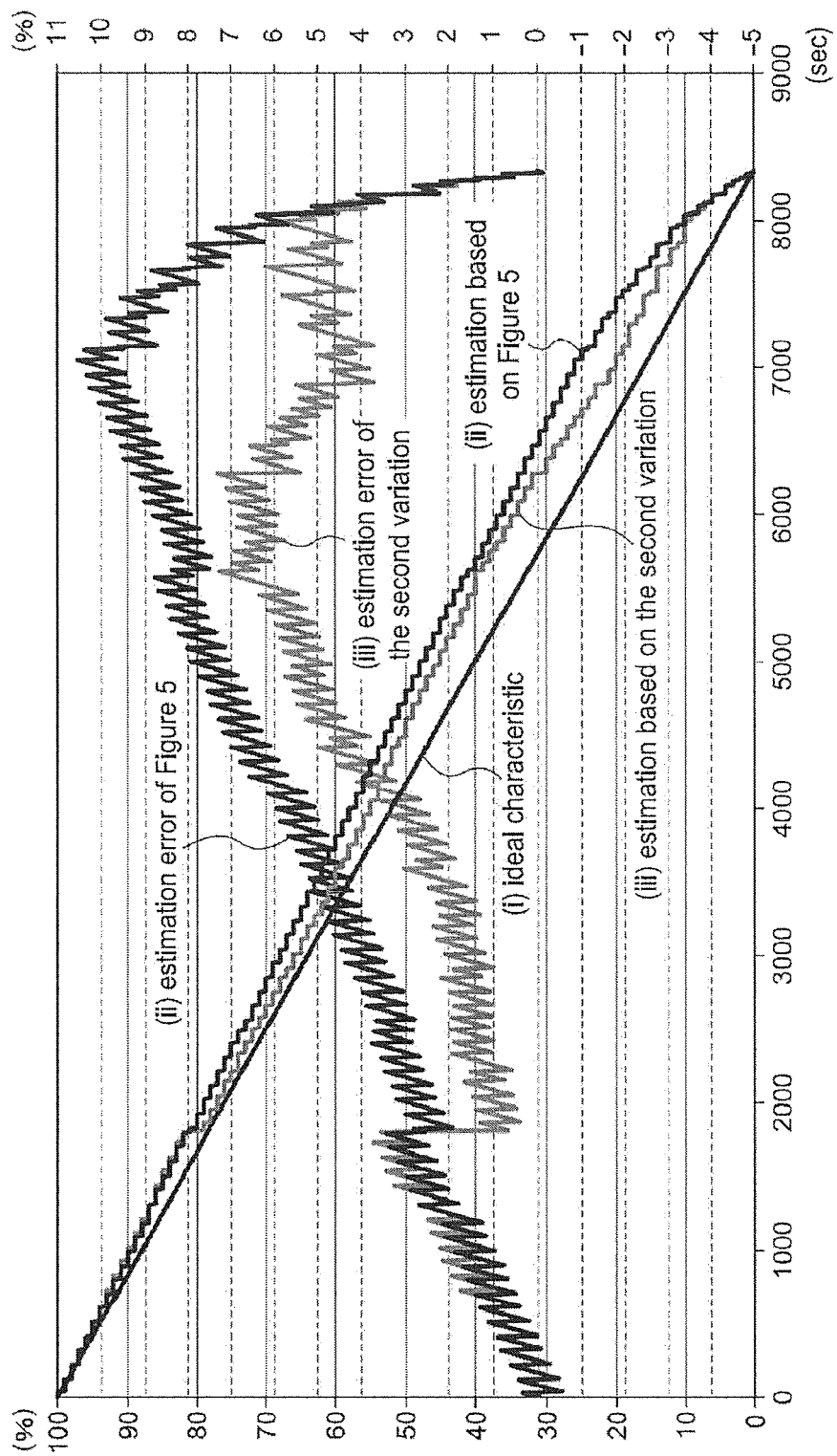
FIG. 15 shows an estimation result of SOC in remaining capacity detection according to a second variation.

FIG. 15 shows an estimation result of SOC by a remaining capacity detecting method according to the second variation. The estimated SOC is shown when the battery is discharged at a constant load (0.35 C). (i) is the ideal SOC and becomes a straight line at a constant load. (ii) shows the estimated SOC based on the flowchart of FIG. 5, and (iii) shows the estimated SOC based on the flowchart of the second variation. In addition, FIG. 15 shows the error between each estimated SOC and the ideal SOC. As can be seen from FIG. 15, since the second variation takes the SOC dependency of the voltage drop $V_{DROP}$ into account, the error can be reduced and the estimation accuracy can be improved.

(Third variation) In the second variation, an SOC dependency of the voltage drop $V_{DROP}$ is corrected by a lookup table. This action may be approximated by the following equation:

$$VDR(SOC) = 10^{\wedge}\alpha * ln(log_{10}(\beta * SOC)) + \theta$$

where $\alpha$, $\beta$, $\theta$ are deterioration-temperature coefficients.

Figure 17:
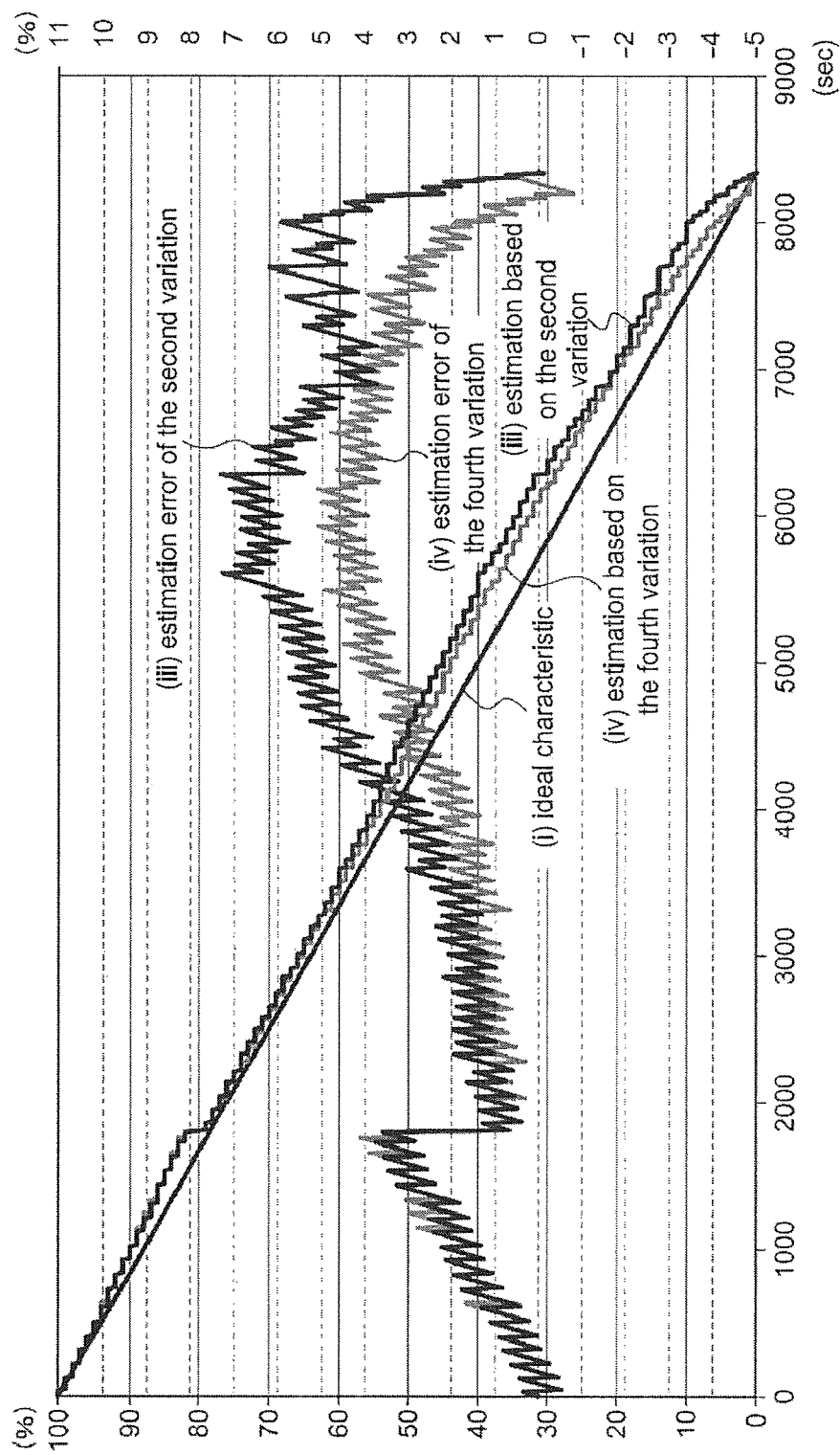
FIG. 17 shows an estimation result of SOC in remaining capacity detection according to a fourth variation.

(Fourth variation) The fourth variation further improves the accuracy of the second variation. In the fourth variation, the temperature dependency of VDR is taken into consideration. FIG. 16 shows an extended VDR lookup table. As shown in FIG. 16, the VDR lookup table is provided for several temperatures. When executing the routine of FIG. 14, the temperature is measured and the value of VDR is obtained based on the value in the look-up table corresponding to the temperature. FIG. 17 shows an estimation result of SOC by a remaining capacity detecting method according to the fourth variation. In the fourth variation, since the temperature dependency of the voltage drop $V_{DROP}$ is taken into account, the error can be further reduced and the estimation accuracy can be improved.

In the fourth variation, the VDR table for each temperature may be approximated by an equation.

(Fifth variation) When the correction process is performed, the amount of calculation of the correction circuit 208 increases, and the power consumption increases. In order to reduce power consumption, the correction process may be enabled when the voltage $V_{BAT}$ of the battery 102 is lower than a predetermined voltage value $V_{TH}$. For the voltage value $V_{TH}$, an appropriate value may be selected for each system. In many cases, a user is interested in the remaining capacity (SOC) of the battery 102 when SOC falls, that is, when $V_{BAT}$ drops. The second variation can enable the correction process based on user demand. It should be noted that the correction process may be enabled when SOC is lower than a predetermined value.

(Sixth variation) A correction process may be enabled intermittently at a predetermined interval. When correction is always enabled, power consumption increases. Therefore, by intermittently performing a correction process at a predetermined interval, it is possible to reduce such increase in power consumption due to the correction.

The predetermined interval may be longer than 1 second and shorter than 60 seconds. Performing a correction process at such interval can improve the accuracy of SOC sufficiently within a range of reasonable power consumption increase. For applications where the voltage drop $V_{DROP}$ varies over time scales greater than 60 seconds, the predetermined interval can be increased.

(Seventh variation) The correction process may be enabled each time the SOC changes by a predetermined amount (n %, where n is an arbitrary real number). According to this variation, an increase in power consumption due to correction can be reduced.

(Eighth variation) In an embodiment, a dedicated voltage detection circuit 204 for monitoring a voltage $V_{BAT}$ of the battery 502 is provided, but the present invention is not limited thereto. In a battery management system 100, when there is already a circuit for detecting the battery voltage $V_{BAT}$, the value $V_{BAT1}$ detected by the circuit may be used. Further, the battery voltage $V_{BAT}$ may monitor the voltage of a positive electrode (+) of the battery 102. However, the method is not limited to such, and the voltage of another node (line) may alternatively be monitored. For example, in a system in which a load switch is provided between the battery 102 and the load 108, the voltage of the node (line) on the side of the load 108 may be monitored rather than the load switch. This is effective when the voltage drop of the load switch is large.

(Ninth variation) Correction of an SOC-OCV characteristic and correction of values CC, $CC_{FULL}$, and SOC may be used together.

Figure 18:
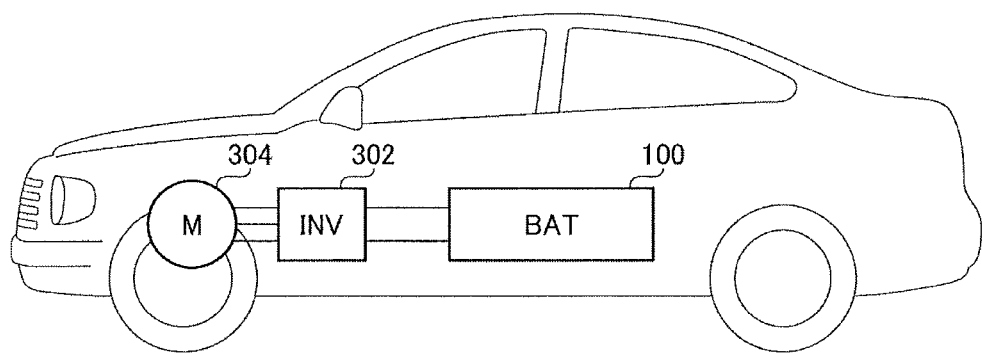
FIG. 18 shows an automobile including a battery management system.

Finally, applications of a battery management system 100 will be described. FIG. 18 shows a vehicle 300 including a battery management system 100. The automobile 300 is an electric vehicle (EV), a plug-in hybrid vehicle (PHV), a hybrid vehicle (HV), or the like. An inverter 302 receives a voltage $V_{BAT}$ from the battery management system 100, converts it into an alternating current, supplies the alternating current to a motor 304, and powers the motor 304. When decelerating, such as when a brake pedal is depressed, the inverter 302 performs a regenerative operation and recovers the current generated by the motor 304 to a battery 102 of the battery management system 100. In PHV and EV, a charging circuit for charging the battery 102 of the battery management system 100 is additionally provided.

Figure 19:
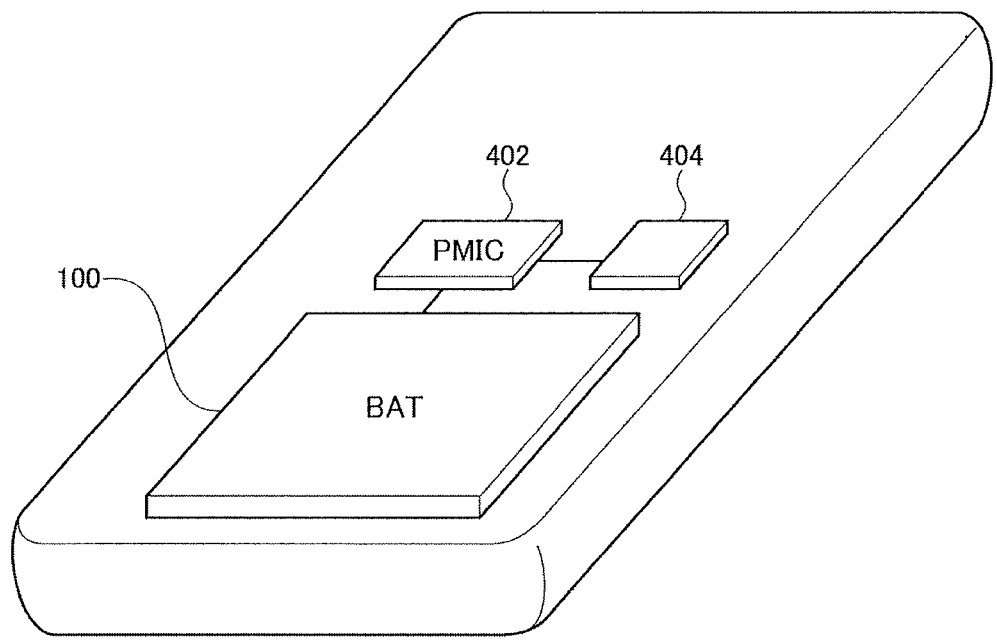
FIG. 19 shows an electronic device including a battery management system.

FIG. 19 shows an electronic device 400 including a battery management system 100. In addition to the battery management system 100, the electronic device 400 includes a PMIC (power management IC) 402, a processor 404, and other electronic circuits (not shown). The PMIC 402 includes a plurality of integrated power supply circuits and supplies appropriate power supply voltages to the processor 404 and other electronic circuits.

In addition, a battery management system 100 can be used for industrial equipment, industrial machinery, power storage systems for residential or industrial use, power supply for elevator systems, and the like.

While the present invention has been described with reference to specific embodiments, it is to be understood that the embodiments are only illustrative of the principles and applications of the invention. Many variations and arrangements can be made in the embodiments without departing from the spirit of the present invention as defined in the claims.

What is claimed is:

1. A method of detecting SOC (State Of Charge) of a rechargeable battery, comprising:
    (1) a step of generating a coulomb count value CC by integrating charge and discharge currents of the battery;
    (2) a step of generating an SOC value SOC1 by Equation (1):

$$SOC1=(CC_{FULL}-CC)/CC_{FULL}\times 100 \qquad (1)$$

wherein $CC_{FULL}$ is a coulomb count capacity value corresponding to full charge;
    (3) correction steps, including:
       (3-1) a step of generating an OCV (Open Circuit Voltage) value OCV1 corresponding to the value SOC1 on the basis of an SOC-OCV characteristic indicating a relation between SOC and OCV predetermined for the battery;
       (3-2) a step of detecting a battery voltage $V_{BAT}$ of the battery;
       (3-3) a step of generating a voltage drop $V_{DROP1}$ between the value OCV1 and a detected value $V_{BAT1}$ of the battery voltage $V_{BAT}$;
       (3-4) a step of generating a value OCV2 which is higher than a minimum operating voltage $V_{BAT\_MIN}$ of the system by a voltage width $\Delta V$ corresponding to the voltage drop $V_{DROP1}$;
       (3-5) a step of generating an SOC value SOC2 corresponding to the value OCV2 based on the SOC-OCV characteristic; and
       (3-6) a step of generating a correction result by correcting at least one of the values SOC1, CC, $CC_{FULL}$, and the SOC-OCV characteristic on assumption that the value SOC2 corresponds to zero remaining capacity; and
    (4) a step of referring to the correction result to charge or discharge the battery.

2. The detecting method of claim 1, wherein $\Delta V=V_{DROP1}$.

3. The detecting method of claim 1, further comprising:
    a step of previously holding an SOC dependency of the voltage drop $V_{DROP}$ between OCV and voltage of the battery;
    a step of generating a provisional OCV value $OCV3=V_{BAT\_MIN}+V_{DROP1}$;
    a step of generating a provisional SOC value SOC3 corresponding to the provisional OCV value OCV3; and
    a step of generating a voltage drop $\Delta V$ at the value SOC3 based on the voltage drop $V_{DROP1}$ at SOC1 and the SOC dependency of the voltage drop $V_{DROP}$.

4. The detecting method of claim 1, wherein the correction step (3-6) corrects the coulomb count capacity value $CC_{FULL}$ to a new value $CC_{FULL}'$ obtained by Equation (2):

$$CC_{FULL}'=CC_{FULL}\times(100-SOC2)/100 \qquad (2).$$

5. The detecting method of claim 4, wherein the correction step (3-6) corrects the coulomb count value CC to a new value CC' obtained by Equation (3):

$$CC'=CC-(CC_{FULL}-CC_{FULL}') \qquad (3).$$

6. The detecting method of claim 4, wherein the correction step (3-6) corrects the coulomb count value CC to a new value CC' obtained by Equation (4):

$$CC'=CC-CC_{FULL}\times SOC2/100 \qquad (4).$$

7. The detecting method of claim 1, wherein the correction step (3-6) sets a new value SOC' obtained by Equation (5) as a corrected SOC:

$$SOC'=SOC1\times 100/(100-SOC2) \qquad (5).$$

8. The detecting method of claim 4, wherein the correction step (3-6) does not correct the coulomb count value CC.

9. The detecting method of claim 1, wherein the correction step (3-6) sets a new value SOC' obtained by Equation (6) as a corrected SOC:

$$SOC'=\{CC_{FULL}-CC\times 100/(100-SOC2)\}/CC_{FULL}\times 100 \qquad (6).$$

10. The detecting method of claim 1, wherein the correction step (3-6) corrects the coulomb count value CC to a new value CC' obtained by Equation (7), without correcting the coulomb count capacity value $CC_{FULL}$:

$$CC'=CC\times 100/(100-SOC2) \qquad (7).$$

11. The detecting method of claim 4, wherein the correction step (3-6) corrects the coulomb count value CC to a new value CC' obtained by Equation (8):

$$CC'=CC\times(100-SOC2)/100 \qquad (8).$$

12. The detecting method of claim 1, wherein the correction step (3-6) corrects the SOC-OCV characteristic according to Equation (9):

$$SOC'=100-(100-SOC)\times 100/(100-SOC2) \qquad (9).$$

13. The detecting method of claim 1, wherein the SOC-OCV characteristic associates the range of the OCV lower than the minimum operating voltage of the system with negative SOC values.

14. The detecting method of claim 1, wherein the correction is enabled when the voltage of the battery is lower than a predetermined voltage value.

15. The detecting method of claim 1, wherein the correction is enabled when the SOC is lower than a predetermined value.

16. The detecting method of claim 1, wherein the correction is enabled intermittently at a predetermined interval.

17. The detecting method of claim 16, wherein the predetermined interval is longer than 1 second and shorter than 60 seconds.

18. A remaining capacity detection circuit for detecting SOC (State Of Charge) of a rechargeable battery, comprising:
    a coulomb counter circuit for generating a coulomb count value CC by integrating charge and discharge currents of the battery;
    a voltage detection circuit for detecting a battery voltage $V_{BAT}$ of the battery;
    an SOC calculator for calculating an SOC value SOC1 by Equation (1):

$$SOC1=(CC_{FULL}-CC)/CC_{FULL} \times 100 \qquad (1),$$

wherein $CC_{FULL}$ is a coulomb count capacity value corresponding to full charge; and
    a correction circuit, performing:
        a step of generating an OCV (Open Circuit Voltage) value OCV1 corresponding to the value SOC1 on the basis of an SOC-OCV characteristic indicating a relation between SOC and OCV predetermined for the battery;
        a step of generating a voltage drop $V_{DROP1}$ between the value OCV1 and a voltage value $V_{BAT1}$ detected by the voltage detection circuit;
        a step of generating a value OCV2 which is higher than a minimum operating voltage $V_{BAT\_MIN}$ of the system by a voltage width $\Delta V$ corresponding to the voltage drop $V_{DROP1}$;
        a step of generating an SOC value SOC2 corresponding to the value OCV2 based on the SOC-OCV characteristic; and
        a step of generating a correction result by correcting at least one of the values SOC1, CC, $CC_{FULL}$, and SOC-OCV characteristic on the assumption that the value SOC2 corresponds to zero remaining capacity, wherein the battery is charged or discharged using the correction result generated by the correction circuit.

19. The remaining capacity detection circuit of claim 18, wherein $\Delta V = V_{DROP1}$.

20. The remaining capacity detection circuit of claim 18, wherein the correction circuit further performs:
    a step of holding an SOC dependency of the voltage drop $V_{DROP}$ between OCV and battery voltage;
    a step of generating a provisional OCV value $OCV3=V_{BAT\_MIN}+V_{DROP1}$;
    a step of generating a provisional SOC value SOC3 corresponding to the provisional OCV value OCV3; and
    a step of generating a voltage drop $\Delta V$ at the value SOC3 based on the voltage drop $V_{DROP1}$ at SOC1 and the SOC dependency of the voltage drop $V_{DROP}$.

21. The remaining capacity detection circuit of claim 18, wherein the correction step corrects the coulomb count capacity value $CC_{FULL}$ to a new value $CC_{FULL}'$ obtained by Equation (2):

$$CC_{FULL}'=CC_{FULL}(100-SOC2)/100 \qquad (2).$$

22. The remaining capacity detection circuit of claim 21, wherein the correction step corrects the coulomb count value CC to a new value CC' obtained by Equation (3):

$$CC'=CC-(CC_{FULL}-CC_{FULL}') \qquad (3).$$

23. The remaining capacity detection circuit of claim 21, wherein the correction step corrects the coulomb count value CC to a new value CC' obtained by Equation (4):

$$CC'=CC-CC_{FULL} \times SOC2/100 \qquad (4).$$

24. The remaining capacity detection circuit of claim 18, wherein the correction step corrects the SOC1 to a new value SOC' obtained by Equation (5):

$$SOC'=SOC1 \times 100/(100-SOC2) \qquad (5).$$

25. The remaining capacity detection circuit of claim 18, wherein the correction step does not correct the coulomb count value CC.

26. The remaining capacity detection circuit of claim 18, wherein the correction step sets a new value SOC' obtained by Equation (6) as a corrected SOC:

$$SOC'=\{CC_{FULL}-CC \times 100/(100-SOC2)\}/CC_{FULL} \times 100 \qquad (6).$$

27. The remaining capacity detection circuit of claim 18, wherein the correction step corrects the coulomb count value CC to a new value CC' obtained by Equation (7), without correcting the coulomb count capacity value $CC_{FULL}$:

$$CC'=CC \times 100/(100-SOC2) \qquad (7).$$

28. The remaining capacity detection circuit of claim 21, wherein the correction step corrects the coulomb count value CC to a new value CC' obtained by Equation (8):

$$CC'=CC \times (100-SOC2)/100 \qquad (8).$$

29. The remaining capacity detection circuit of claim 18, wherein the correction step corrects the SOC-OCV characteristic according to Equation (9):

$$SOC'=100-(100-SOC) \times 100/(100-SOC2) \qquad (9).$$

30. The remaining capacity detection circuit of claim 18, wherein the SOC-OCV characteristic associates the range of the OCV lower than the minimum operating voltage of the system with negative SOC values.

31. The remaining capacity detection circuit of claim 18, wherein the correction circuit is enabled when the voltage of the battery is lower than a predetermined voltage value.

32. The remaining capacity detection circuit of claim 18, wherein the correction circuit is enabled when the SOC is lower than a predetermined value.

33. The remaining capacity detection circuit of claim 18, wherein the correction circuit is enabled intermittently at a predetermined interval.

34. The remaining capacity detection circuit of claim 33, wherein the predetermined interval is longer than 1 second and shorter than 60 seconds.

35. An electronic device, comprising:
    a rechargeable battery; and
    the remaining capacity detection circuit of claim 18.

36. An automobile, comprising:
    a rechargeable battery; and
    the remaining capacity detection circuit of claim 18.

* * * * *